United States Patent
Bayerer et al.

(10) Patent No.: US 8,120,391 B2
(45) Date of Patent: Feb. 21, 2012

(54) CIRCUIT ARRANGEMENT INCLUDING A VOLTAGE SUPPLY CIRCUIT AND SEMICONDUCTOR SWITCHING ELEMENT

(75) Inventors: Reinhold Bayerer, Warstein (DE); Peter Kanschat, Soest (DE); Uwe Jansen, Werl (DE)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 12/571,114

(22) Filed: Sep. 30, 2009

(65) Prior Publication Data
US 2010/0085105 A1    Apr. 8, 2010

(30) Foreign Application Priority Data
Sep. 30, 2008   (DE) .................. 10 2008 049 677

(51) Int. Cl.
   *H03K 3/00*   (2006.01)
(52) U.S. Cl. ..................................... 327/108; 327/112
(58) Field of Classification Search ........... 327/108–112
   See application file for complete search history.

(56) References Cited

U.S. PATENT DOCUMENTS

| | | | |
|---|---|---|---|
| 4,511,815 A | 4/1985 | Wood | |
| 5,148,048 A * | 9/1992 | Kawasaki et al. | 327/170 |
| 5,455,758 A | 10/1995 | Pelly | |
| 5,818,214 A | 10/1998 | Pelly et al. | |
| 5,920,472 A | 7/1999 | Bijlenga et al. | |
| 5,952,740 A | 9/1999 | Maeda et al. | |
| 6,738,601 B1 * | 5/2004 | Rofougaran et al. | 455/66.1 |
| 6,937,054 B2 * | 8/2005 | Hsu et al. | 326/30 |
| 7,126,403 B2 * | 10/2006 | Kenney et al. | 327/291 |
| 7,157,972 B2 * | 1/2007 | Hajimiri et al. | 330/277 |

FOREIGN PATENT DOCUMENTS

| | | |
|---|---|---|
| DE | 3124891 A1 | 1/1983 |
| DE | 3215589 A1 | 10/1983 |
| DE | 3244623 A1 | 9/1984 |
| DE | 4441492 A1 | 5/1996 |
| DE | 19963330 C1 | 9/2000 |
| DE | 19910327 C2 | 11/2001 |
| DE | 10027088 C2 | 5/2003 |
| EP | 0784376 B1 | 7/2003 |
| EP | 0751570 B1 | 8/2003 |
| EP | 0998018 B1 | 12/2003 |
| EP | 1143619 B1 | 7/2005 |
| EP | 0 868 014 | 9/2010 |

OTHER PUBLICATIONS

B. Strzalkowski, "Neue Moglichkeiten der Systemintegration in der Leistungselektronik mittels planarer integrierter Mikrotransformatoren" Oct. 10, 2006 (6 pages).

* cited by examiner

*Primary Examiner* — Kenneth B. Wells
(74) *Attorney, Agent, or Firm* — Dicke, Billig & Czaja, PLLC

(57) ABSTRACT

A circuit arrangement comprising a first semiconductor switching element, which has a load path and a drive terminal. A voltage supply circuit, is provided including an inductance connected in series with the load path of the first semiconductor switching element, and a capacitive charge storage arrangement, which is connected in parallel with the inductance and which has a first and a second output terminal for providing a supply voltage.

10 Claims, 13 Drawing Sheets

US 8,120,391 B2

CIRCUIT ARRANGEMENT INCLUDING A VOLTAGE SUPPLY CIRCUIT AND SEMICONDUCTOR SWITCHING ELEMENT

CROSS-REFERENCE TO RELATED APPLICATIONS

This Utility patent application claims priority to German Patent Application No. DE 10 2008 049 677.4-31, filed on Sep. 30, 2008, and incorporated herein by reference.

BACKGROUND

Semiconductor switching elements can be used as switches for switching electrical loads. Such semiconductor switching elements are, e.g., MOS transistors, such as MOSFET or IGBT. For driving the semiconductor switching elements in the on state or in the off state drive circuits are used, the drive circuits being connected to a drive terminal of the semiconductor switching element and requiring a supply voltage for providing a drive signal for the semiconductor switching element.

Drive circuits for semiconductor switching elements, which have to be able to provide a floating drive voltage for the semiconductor switching element, accordingly require a floating supply voltage. Such drive circuits are, e.g., the drive circuits of n- or p-conducting MOSFETs, or of IGBTs, which are interconnected as high-side switches.

For providing a floating supply voltage for drive circuits of semiconductor switching elements, bootstrap circuits may be used, for example. Further, transformers may be used that convert a supply voltage referred to a reference potential to a desired supply voltage.

For these and other reasons there is a need for the present invention.

SUMMARY

One embodiment of the present disclosure relates to a circuit arrangement including a first semiconductor switching element having a load path and a drive terminal, and including a voltage supply circuit. The voltage supply circuit includes: an inductance connected in series with the load path of the first semiconductor switching element; a capacitive charge storage arrangement, which is connected in parallel with the inductance and which has a first and a second output terminal for providing a supply voltage.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Examples are explained below with reference to drawings. The main emphasis is on explaining the basic principle. Consequently, only the circuit components and signals necessary for understanding this basic principle are illustrated in the drawings. In the drawings, unless indicated otherwise, identical reference symbols designate identical parts with the same meaning.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
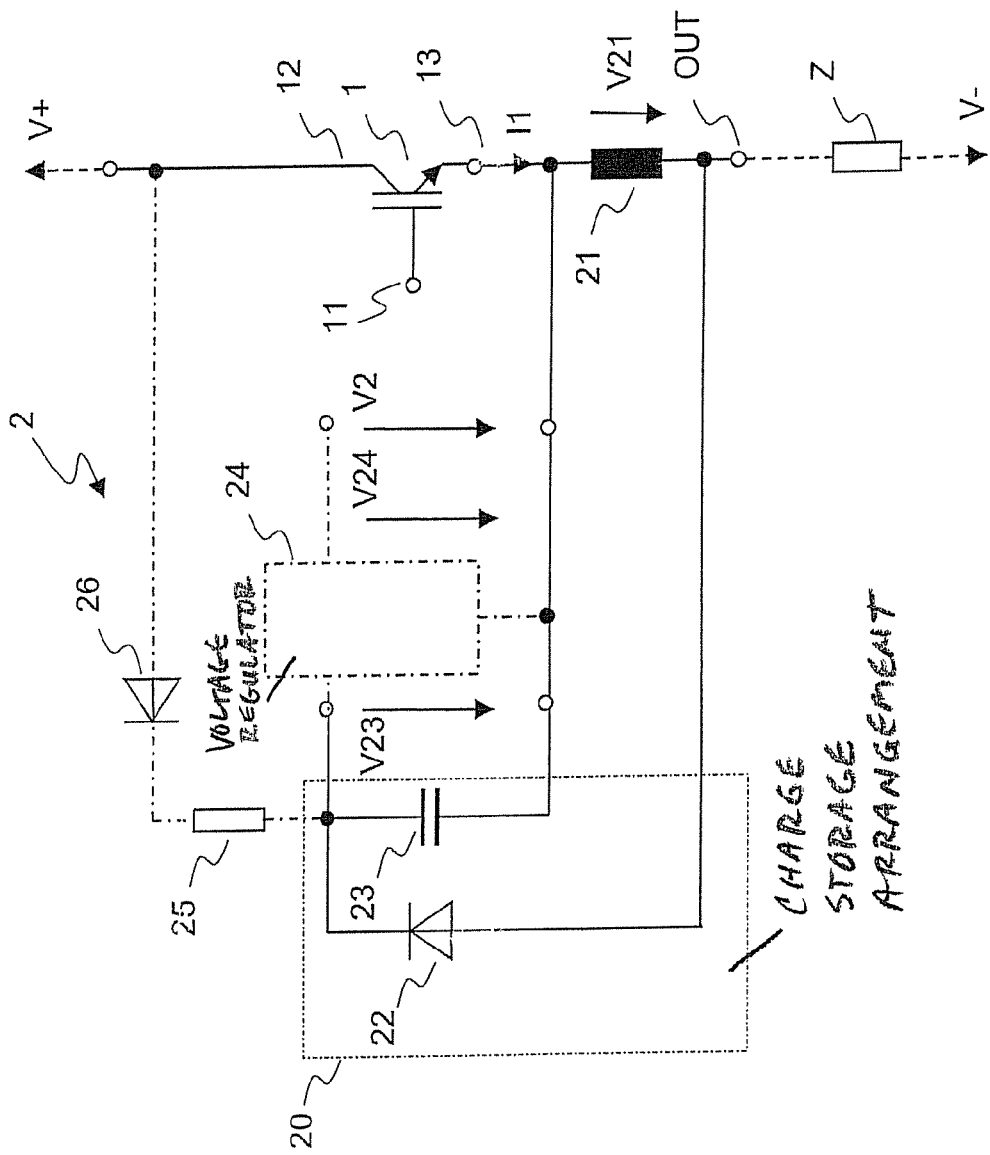
FIG. 1 illustrates one embodiment of a circuit arrangement including a semiconductor switching element and a voltage supply circuit.

FIG. 1 illustrates by way of an electrical circuit diagram one embodiment of a circuit arrangement including a semiconductor switching element 1, and a voltage supply circuit 2. The semiconductor switching element 1 has a drive terminal 11, first and second load path terminals 12, 13, and a load path running between the load path terminals 12, 13. In the example illustrated, the semiconductor switching element 1 is an IGBT having a base terminal 11, which forms a drive terminal, a collector terminal 12, which forms a first load path terminal, and an emitter terminal 13, which forms a second load path terminal. It should be pointed out that the use of an IGBT as semiconductor switching element 1 should be understood merely as an example. Instead of an IGBT it is possible, of course, to use any further semiconductor switching elements, in one embodiment a MOSFET. In the case of a MOSFET, the drive terminal is formed by a gate terminal, and first and second load path terminals are formed by drain and source terminals.

The semiconductor switching element 1 illustrated serves as a switch for switching an electric current I1 flowing to an output terminal OUT. An electrical load Z may be connected to the output terminal OUT, the load likewise being illustrated in FIG. 1 (depicted by dashed lines) for explanation purposes. Load Z may be any electrical load and may include in one embodiment a further semiconductor switching element that forms a half-bridge circuit with the semiconductor switching element 1 illustrated in FIG. 1.

During operation of the circuit arrangement, the load path 12-13 of the semiconductor switching element 1 is connected in series with the load Z between terminals for a positive supply potential V+ and a negative supply potential V−. These supply potentials are also referred to hereinafter as load supply potentials. A voltage present between the terminals is referred to hereinafter as load supply voltage. Load Z may be any passive or active electrical load.

The semiconductor switching element is, in one embodiment, a power IGBT or a power MOSFET having a voltage blocking capability from a few tens of volts up to a few kV depending on the specific form of realization. A freewheeling element (not illustrated), such as e.g., a diode, may be present in parallel with the load path of the semiconductor switching element 1. In the case of a MOSFET, the freewheeling element can be formed by an integrated body diode.

The circuit arrangement has a voltage supply circuit 2 for providing a supply voltage V2. The supply voltage V2 can be used, in a manner that will be explained below, for example for the voltage supply of a drive circuit (not illustrated in FIG. 1) of the semiconductor switch 1, but can also be used for the voltage supply of any other circuit components of the circuit arrangement.

The voltage supply circuit 2 has an inductance 21 connected in series with the load path 12-13 of the semiconductor switching element 1 and, in the example illustrated, between the second load path terminal 13 and the output terminal OUT. The inductance 21 is for example a parasitic inductance, such as e.g., a line inductance, a conductor track inductance or a bonding wire inductance and is formed by lines, conductor tracks or bonding wires that are present between the output terminal OUT and the second load path terminal 13—the emitter terminal in the case of an IGBT. However, the inductance can also be produced deliberately in terms using circuit technology.

Connected in parallel with the inductance 21 is a capacitive storage arrangement 20, which, in the example illustrated, includes a series circuit including a rectifier element 22, such as e.g., a diode, and a capacitive storage element 23, such as e.g., a capacitor. In this voltage supply circuit 2, an electrical voltage V23 with respect to the electrical potential of the second load path terminal 13 can be tapped off across the capacitive storage element 23. This voltage V23 across the capacitive storage element 23 can be used directly as supply voltage V2 at the output of the voltage supply circuit 2.

The voltage supply circuit 2 optionally has a voltage regulator 24 that receives the voltage V23 present across the capacitive storage element 23, and that generates a regulated voltage V24 from the voltage V23 present across the capacitive storage element 23, the regulated voltage being used as output voltage V2 of the voltage supply circuit 2. The voltage regulator 24 may be any voltage regulator, in one embodiment a linear regulator or a switching regulator, which is able to generate a regulated voltage V24 from the unregulated voltage present across the capacitive storage element 23. The voltage regulator 24 may also be realized as a charge pump, or may include such a charge pump, and can therefore be designed to generate a higher voltage V24 at its output from the voltage V23 across the capacitive storage element.

During switching operations of the semiconductor switching element 1, electrical voltage is induced in the inductance 21. This induced electrical voltage is utilized in the voltage supply circuit 2 for charging the capacitive storage element 23 of the charge storage arrangement, and thus for generating the supply voltage V2.

The voltage supply circuit 2 illustrated in FIG. 1 utilizes the electrical voltage induced in the inductance 21 when the semiconductor switching element 1 is turned off. For the purposes of the explanation it shall be assumed that the semiconductor switching element 1 is initially driven in the on state by a drive circuit (not illustrated in more specific detail). During this operating state, an electrical current I1 flows through the load path 12, 13, and thus through the inductance 21, the electrical current being referred to hereinafter as load current. If the semiconductor switching element 1 is driven in the off state, then the current I1 decreases. The associated temporal change dI1/dt in the load current I1 results in a voltage V21 induced in the inductance 21. For this voltage V21 applies:

$$V21 = L \cdot dI1/dt \quad (1)$$

where L denotes the inductance value of the inductance 21. In this case, the induced voltage V21 is the greater, the greater the inductance value or the greater the temporal change in the current is.

In the embodiment illustrated, the temporal change in the load current I1, and consequently the voltage V21 induced in the inductance 21, is negative. In this case, the rectifier element 22 and the capacitive storage element 23 of the charge storage arrangement 20 are interconnected in such a way that the capacitive storage element 23 is charged in the case of such a negative voltage V21, in which case a positive voltage V23 is present across the capacitive storage element 23 relative to the electrical potential at the second load path terminal 13. In the example illustrated, the rectifier element 22 is connected for this purpose in the forward direction between that terminal of the inductance 21 which is remote from the second load path terminal 13 and the second load path terminal 13.

The voltage supply circuit 2 which is illustrated in FIG. 1, and which, for providing the supply voltage V2, can utilize parasitic inductances that are inevitably present, can be integrated together with the semiconductor switching element 1 in a common semiconductor chip. For providing the supply voltage V2, no additional terminals at such an integrated circuit including the semiconductor switching element 1 and the voltage supply circuit 2 are necessary in this case.

As already explained, the supply voltage V2 generated by the voltage supply circuit 2 can be used as supply voltage for a drive circuit (not illustrated in FIG. 1) of the semiconductor switching element 1. In order to make a supply voltage V2 available even before the semiconductor switching element 1 has been driven in the on state for the first time, or in order actually to enable the semiconductor switching element 1 to be driven in the on state for the first time, a starting circuit 25, 26 is optionally provided. The starting circuit 25, 26 is connected between a terminal for a supply potential, the terminal for the positive load supply potential V+ in the example, and the capacitive storage element 23 and has, in the example illustrated, a nonreactive (ohmic) resistor 25 and optionally a further rectifier element 26, for example a diode, connected in series with the nonreactive resistor 25. The starting circuit 25, 26 ensures that the capacitive storage element 23 is already charged even before the semiconductor switching element 1 is driven in the on state for the first time. The ohmic resistor 25 can have a very high resistance in order to limit the power loss. The resistor may even have such a high resistance that the electrical energy supplied by using the starting circuit 25, 26, in the case of clocked operation of the semiconductor switching element 1, does not suffice to cover the energy supply of the drive circuit (not illustrated). During the clocked operation, however, the energy supply is then ensured by using the electrical voltage induced in the inductance 21.

A voltage limiting element (not illustrated) may optionally be connected in parallel with the capacitive storage element of the charge storage arrangement, the voltage limiting element preventing the voltage V23 from rising in an uncontrolled manner during the starting phase or during operation. The voltage limiting element used can be, by way of example, a Zener diode in addition to the rectifier element 22. As an alternative, such voltage limiting can also be achieved by the rectifier element 22 being realized as a Zener diode or as a series circuit including a plurality of Zener diodes. The voltage across the rectifier element 23 is limited to approximately 10 V to 20 V, for example.

Such voltage limiting can be used in all the voltage supply circuits additionally explained below, even if that is not explicitly pointed out below. The same applies to the starting circuit.

The optionally present rectifier element 26 of the starting circuit 25, 26 prevents the capacitive storage element 23 from being discharged in the direction of the terminal for the positive load supply potential V+ if the semiconductor switching element 1 is turned on. If the semiconductor switching element 1 is turned on, then the second load path terminal 13 is approximately at the positive supply potential V+. In this case, the electrical potential at that terminal of the capacitive storage element 23 which is remote from the second load path terminal 13 lies above the electrical potential at the second load path terminal 13 by the value of the voltage V23, such that the capacitive storage element 23 would be discharged via the starting circuit if the rectifier element were not present. The rectifier element 26 can be omitted for example when the resistor 25 has a very high resistance and when the semiconductor switching element is driven in clocked fashion, that is to say is switched on and off in clocked fashion. In this case, although the omission of the rectifier element 26 leads to an increase in the power loss, during the switched-on duration of the semiconductor switching element the capacitive storage element is not discharged to such an extent that the generation of the supply voltage is interrupted.

Figure 2:
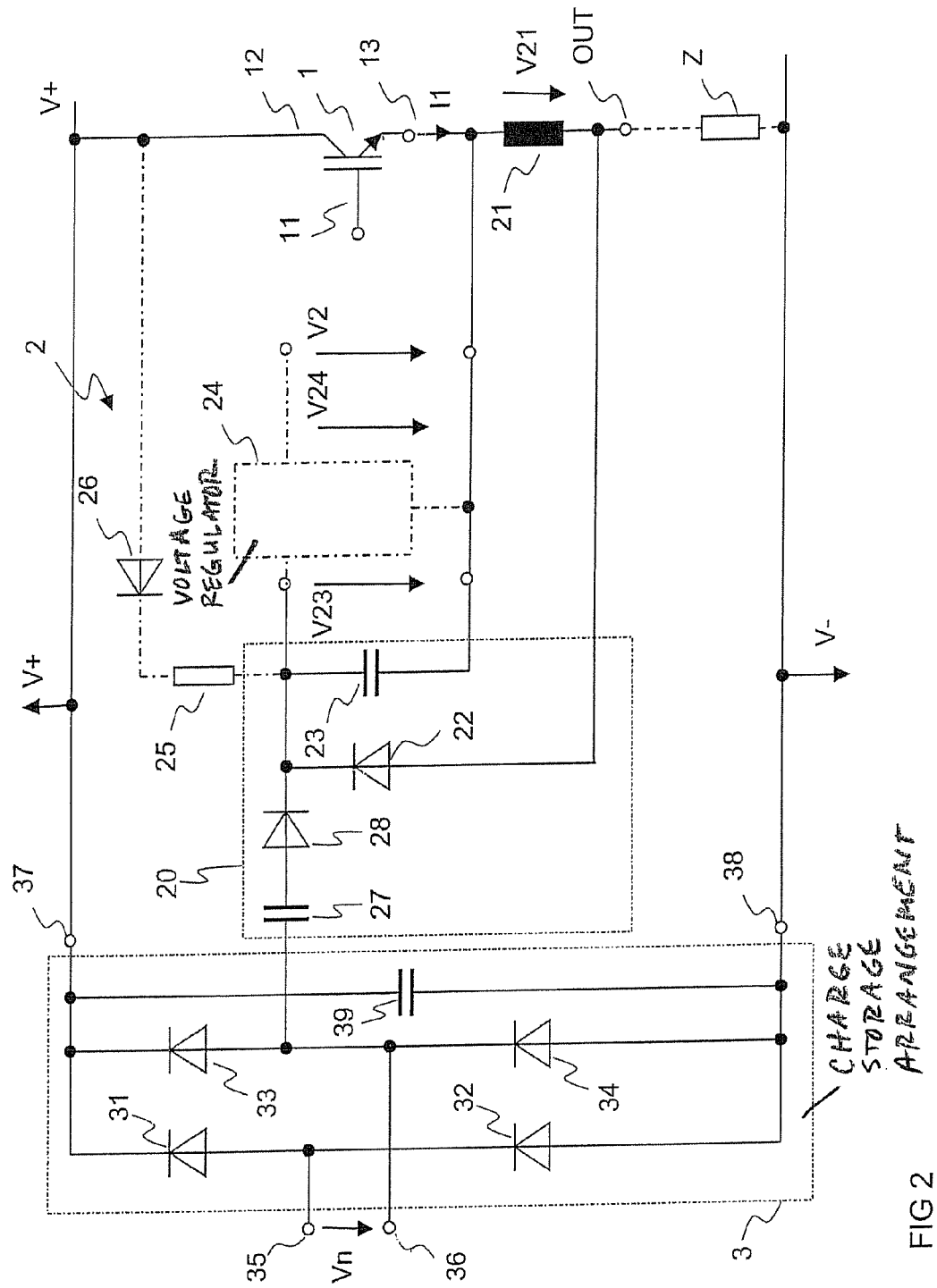
FIG. 2 illustrates a circuit arrangement modified as compared with the embodiment in FIG. 1.

FIG. 2 illustrates a voltage supply circuit 2 with a starting circuit that is modified as compared with the voltage supply circuit in accordance with the embodiment of FIG. 1. In the case of the circuit arrangement illustrated in FIG. 2, the load supply voltage is generated by a rectifier 3 having input terminals 35, 36 for applying an input voltage Vn, e.g., a power supply voltage, and output terminals 37, 38 for providing the load supply voltage. In the example illustrated, one of the output terminals is connected to the negative supply potential V, and the positive load supply potential V+ is available at the other of the output terminals. A smoothing capacitor 39 is optionally present for smoothing the voltage present at the output terminals 37, 38. In the example illustrated, the rectifier 3 is realized as a bridge rectifier having four rectifier elements, such as diodes. If a three-phase input voltage is present, then the rectifier 3 may be extended by a further rectifier branch having two rectifier elements in a sufficiently known manner.

In the case of this circuit arrangement, a starting circuit 27, 28 has a further rectifier element 28 and a capacitor 27, which are connected in series with one another between one of the inputs of the rectifier 3 and the capacitive storage element 23 of the voltage supply circuit 2. In the case of this circuit, the capacitor 27 and the capacitive storage element 23 of the voltage supply circuit 2 form a capacitive voltage divider, which together with the further rectifier element 28 function in the manner of a peak rectifier. In this case, the capacitive storage element 23 is charged to a voltage which is related to the maximum value of the voltage present at the input. A relationship of the voltage at the capacitive storage element 23 and the input voltage is given by the divider ratio of the capacitive voltage divider.

Figure 3:
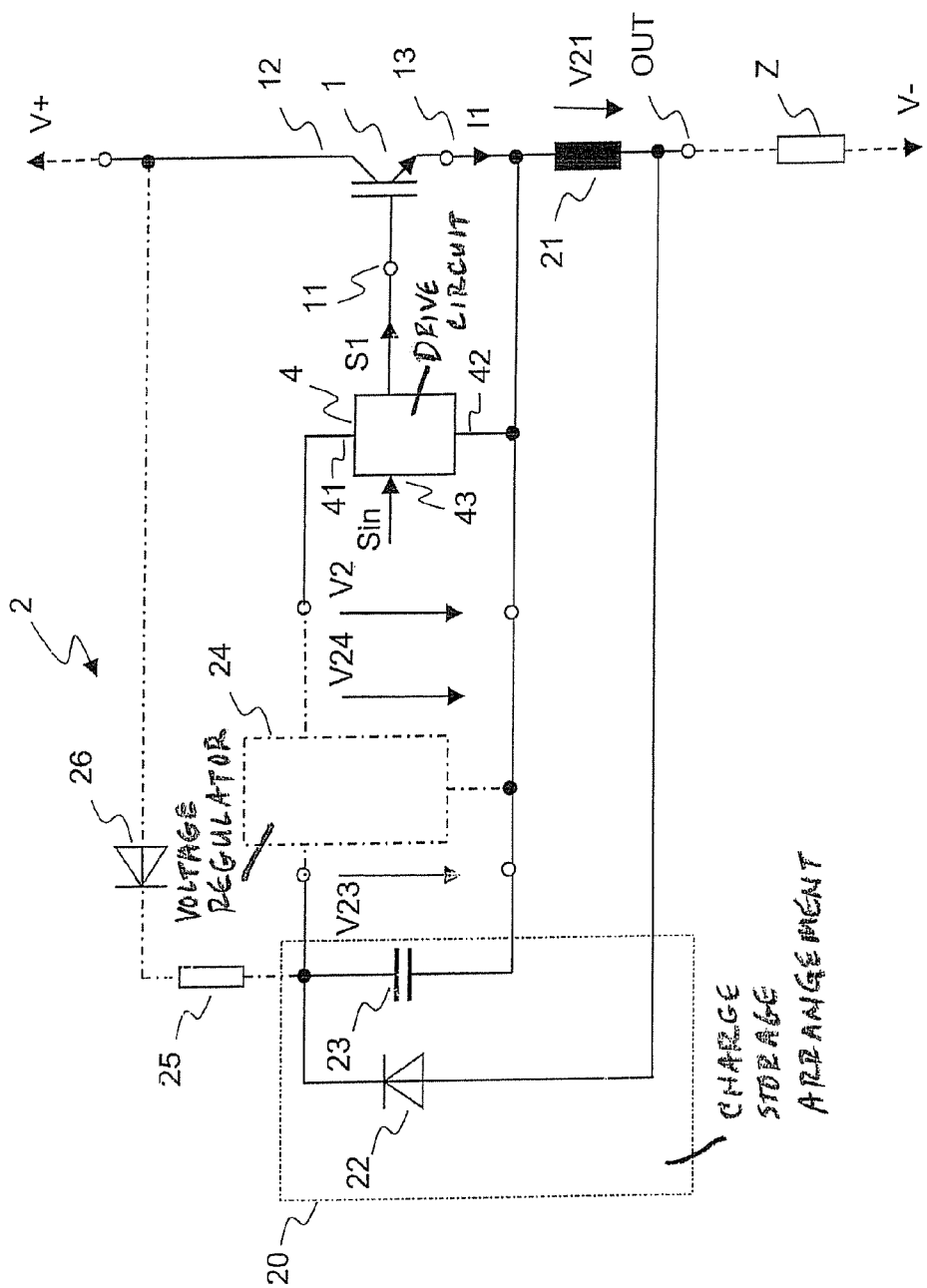
FIG. 3 illustrates one embodiment of a circuit arrangement including a semiconductor switching element, a voltage supply circuit and a drive circuit for the semiconductor switching element, the drive circuit being supplied by the voltage supply circuit.

FIG. 3 illustrates one embodiment of a circuit arrangement having a drive circuit 4 for driving the semiconductor switching element 1. The drive circuit 4 includes an output terminal 44 connected to the drive terminal 11 of the semiconductor switching element, a drive signal S1 being available at the output terminal 44. The drive circuit 4 additionally includes voltage supply terminals 41, 42 that receive the supply voltage V2 provided by the voltage supply circuit 2. The supply voltage, in the manner explained, is either directly the voltage V23 present across the capacitive storage element 23 or the voltage V24 present at the output of the voltage regulator 24.

The drive circuit 4 additionally includes a drive input 43 for receiving a switching signal Sin, in accordance with which the drive circuit 4 generates the drive signal S1. In a manner not illustrated in more specific detail, the switching signal Sin is generated for example by a central control circuit, such as e.g., a microcontroller. This central control circuit is, for example, galvanically isolated (decoupled) from the drive circuit 4. In this case, the transmission of the switching signal Sin from the central control circuit is effected via a potential barrier, such as e.g., an inductive transformer or an optocoupler, or a level shifter.

The switching signal Sin is a two-valued signal, for example, which may assume a switch-on level or a switch-off level. The drive circuit 4 is configured to convert the switching signal Sin into a drive signal S1 suitable for driving the semiconductor switching element 1. In the example illustrated, the drive signal S1 is a voltage relative to the second load path terminal 13 of the semiconductor switching element 1. The IGBT illustrated in FIG. 3 is turned on if the voltage is greater than a threshold voltage specific to the component, and is turned off if the voltage is less than the threshold voltage. The maximum value that can be assumed by the drive voltage S1 present at the output of the drive circuit 4 corresponds to the supply voltage V2 the drive circuit 4 receives from the voltage supply circuit 2. In the case of the circuit arrangement illustrated in FIG. 3, in which the voltage supply circuit 2 generates a supply voltage V2 referred to the second load path terminal 13 of the semiconductor switching element 1, the smallest value that can be assumed by the drive voltage S1 is zero. The drive circuit 4 explained may also be used for driving an n-channel MOSFET in a manner corresponding to that for driving an IGBT.

It should additionally be pointed out that the voltage supply circuits explained above and those additionally explained below are, of course, not restricted to being used in circuit arrangements with n-channel components, rather the voltage supply circuits may also be used in a corresponding manner in circuit arrangements with p-channel components.

Figure 4:
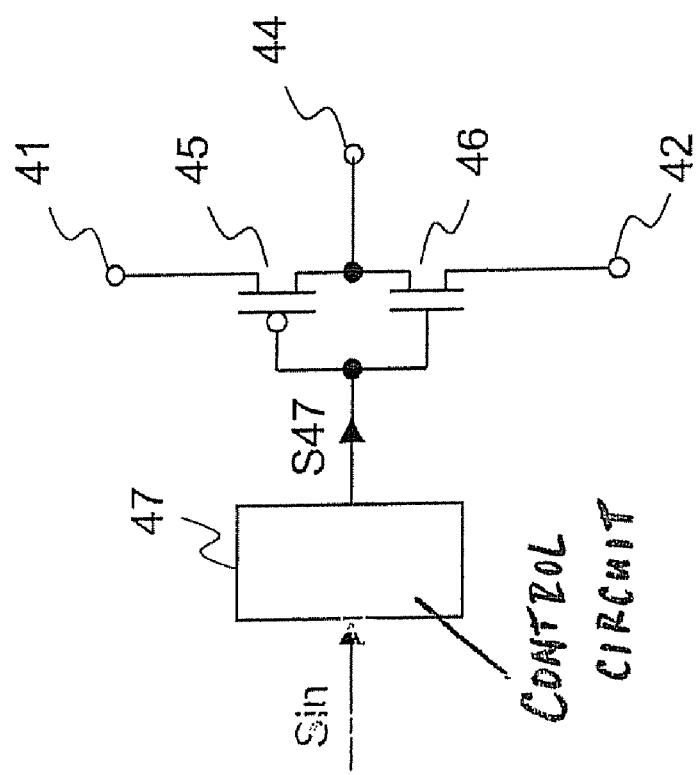
FIG. 4 illustrates one embodiment of a drive circuit.

FIG. 4 illustrates the circuit diagram of one embodiment of a drive circuit 4. The drive circuit 4 illustrated includes an output stage with two complementary transistors 45, 46 that have their load paths connected in series with one another between the supply terminals 41, 42 of the drive circuit 4. In the embodiment illustrated, the transistors 45, 46 are MOS transistors. However, these transistors may also be realized as bipolar transistors in a corresponding manner.

A circuit node common to the load paths of the transistors 45, 46 forms the output 44 of the drive circuit 4. The two transistors 45, 46 are driven by a common control circuit 47 depending on the switching signal Sin. Depending on the signal level of a signal S47 present at the output of the control circuit 47 only one of the two transistors 45, 46 in is turned on at a point in time. If the upper transistor 45 of the two transistors 45, 46—the upper transistor being a p-MOSFET in the embodiment illustrated—is turned on, then the drive voltage S1 corresponds to the difference between the electrical potential at the first supply terminal 41 and the electrical potential at the second load path terminal 13. In the case of the circuit arrangement illustrated in FIG. 3, the difference corresponds to the supply voltage (V2 in FIG. 3). If the lower transistor 46 of the two transistors 45, 46—the lower transistor being an n-MOSFET in the example illustrated, —is turned on, then the drive voltage S1 corresponds to the difference between the electrical potential at the second supply terminal 42 and the electrical potential at the second load path terminal 13—which is zero in the case of the example in accordance with FIG. 3. In the case of this drive circuit 4, the upper transistor 45 is driven in the on state when the switching signal Sin assumes a switch-on level, and the lower transistor 46 is driven in the on state when the switching signal Sin assumes a switch-off level. The control circuit 47 converts the switching signal Sin into the signal S47 suitable for driving the transistors 45, 46. The control circuit 47 may furthermore additionally realize further protection functions that are known in principle, such as e.g., an overtemperature protection. If such an overtemperature protection is present, then the drive circuit 4 turns off the semiconductor switching element 1 during operation when a temperature in the region of the semiconductor switching element 1 exceeds a predetermined temperature threshold value.

In the case of the voltage supply circuit illustrated in FIG. 3, a starting circuit may likewise be present, of course, in accordance with the explanations concerning FIGS. 1 and 2. The starting circuit is not illustrated in FIG. 3, however, for reasons of clarity.

Figure 5:
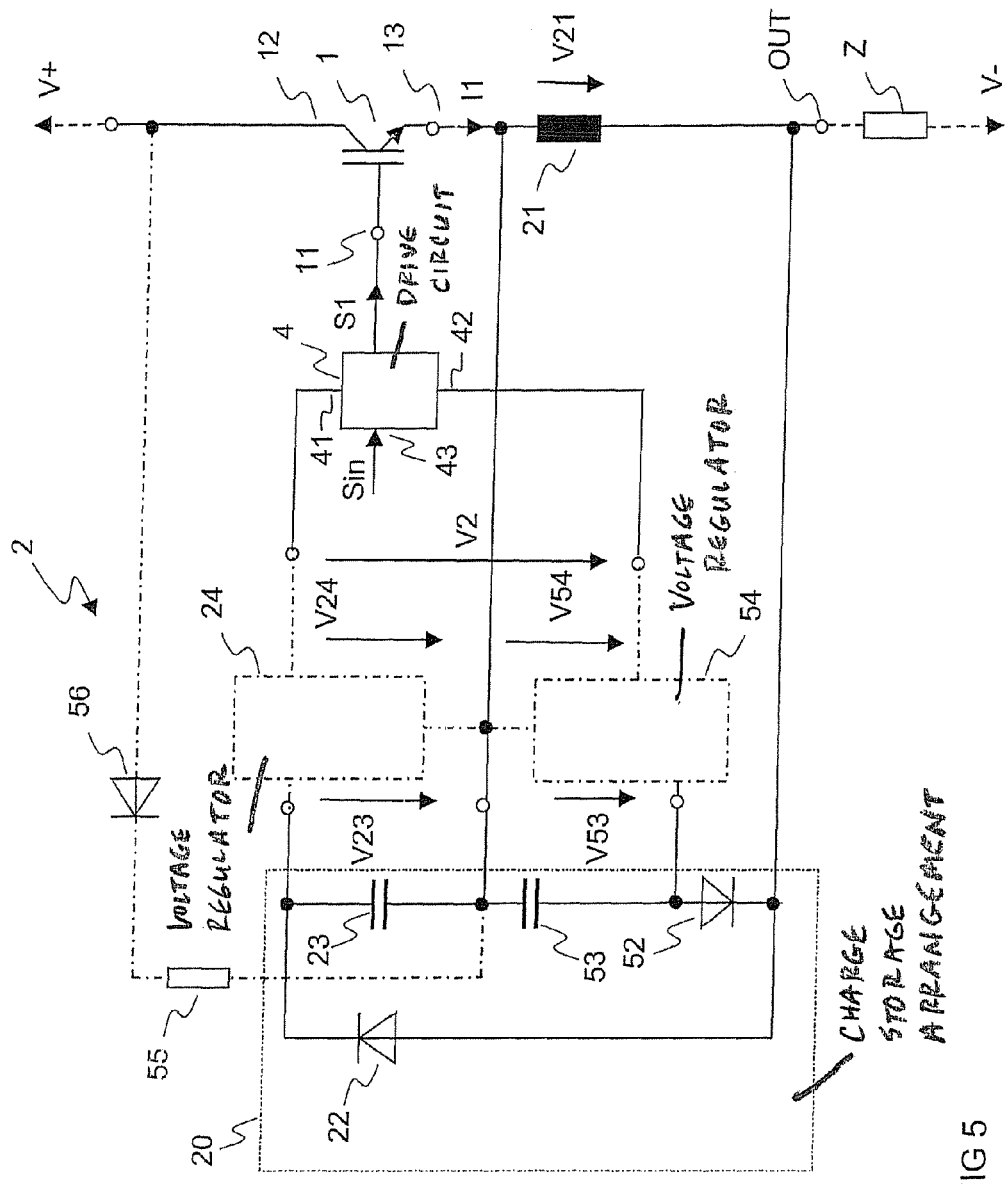
FIG. 5 illustrates one embodiment of a voltage supply circuit that generates a positive and a negative supply voltage.

FIG. 5 illustrates a further embodiment of a voltage supply circuit 2. This voltage supply circuit 2 differs from the voltage supply circuits explained previously in that it also provides, in addition to a positive supply potential referred to the second load path terminal 13, a negative supply potential referred to the second load path terminal 13. In addition to the already explained first series circuit including the first rectifier element 22 and the first capacitive storage element 23, the charge storage arrangement 20 of this voltage supply circuit 2 has a second series circuit including a second rectifier element 52, such as e.g., a diode, and a second capacitive storage element 53, such as e.g., a capacitor. This second series circuit is likewise connected in parallel with the inductance 21, wherein the second rectifier element 52 is oppositely polarized with respect to the first rectifier element 22. In the case of this voltage supply circuit 2, electrical charge is stored in the second capacitive storage element 53 when the voltage V21 present across the inductance 21 is a positive voltage. In the example illustrated, positive voltages are induced in the inductance 21 when the semiconductor switching element 1 is switched on, that is to say when a load current I1 flowing through the semiconductor switching element 1 rises. In the embodiment illustrated, a voltage V53 present across the second capacitive storage element 53 is an electrical voltage that is negative relative to the second load path terminal 13. The sum of the voltages V23, V53 provided by the two capacitive storage elements 23, 53 may be used directly as supply voltage V2 for the drive circuit 4. In this case, the first supply terminal 41 of the drive circuit 4 is connected to the first capacitive storage element 23 and the second supply terminal 42 is connected to the second capacitive storage element 53.

Optionally the electrical voltages V23, V53 present at the capacitive storage elements 23, 53 are converted to regulated voltages V24, V54 by voltage regulators 24, 54. In this case, a first voltage regulator 54 generates a regulated voltage V24 from the voltage V23 across the first capacitive storage element 23, and the second voltage regulator 54 generates a second regulated voltage V54 from the voltage V53 present across the second capacitive storage element 53. In this case, the sum of these two regulated voltages V24, V54 corresponds to the supply voltage V2 provided by the voltage supply circuit 2.

Feeding a negative supply potential in addition to a positive supply potential relative to the potential of the second load path terminal 13 to the drive circuit 4 has the advantage that the drive signal can also assume negative values for driving the semiconductor switching element 1 in the off state in addition to positive values for driving the semiconductor switching element 1 in the on state. A more rapid turn-off of the semiconductor switching element 1 can be achieved using negative drive voltages S1 as compared with using a drive voltage of zero in the case of the circuit arrangement according to FIG. 3.

In the voltage supply circuit 2 according to FIG. 5, a starting circuit may be provided in accordance with the explanations that have been made with reference to FIGS. 1 and 2, the starting circuit being coupled to the first capacitive storage element 23. The starting circuit is not illustrated in FIG. 5, however, for reasons of clarity. A further starting circuit may be provided in a corresponding manner, which provides for a first charging of the second capacitive storage element 53 even before the semiconductor switching element 1 has been driven in the on state for the first time. The further starting circuit includes for example a series circuit including a resistance element 55 and a rectifying element 56, this series circuit being connected between the terminal for the positive supply potential V+ and the second capacitive storage element 53. Instead of this starting circuit including the resistance element 55 and the rectifying element 56, a starting circuit which couples the second capacitive storage element 53 to a rectifier circuit via a rectifying element and a capacitor may also be provided in accordance with the explanations that have been made with reference FIG. 2.

Figure 6:
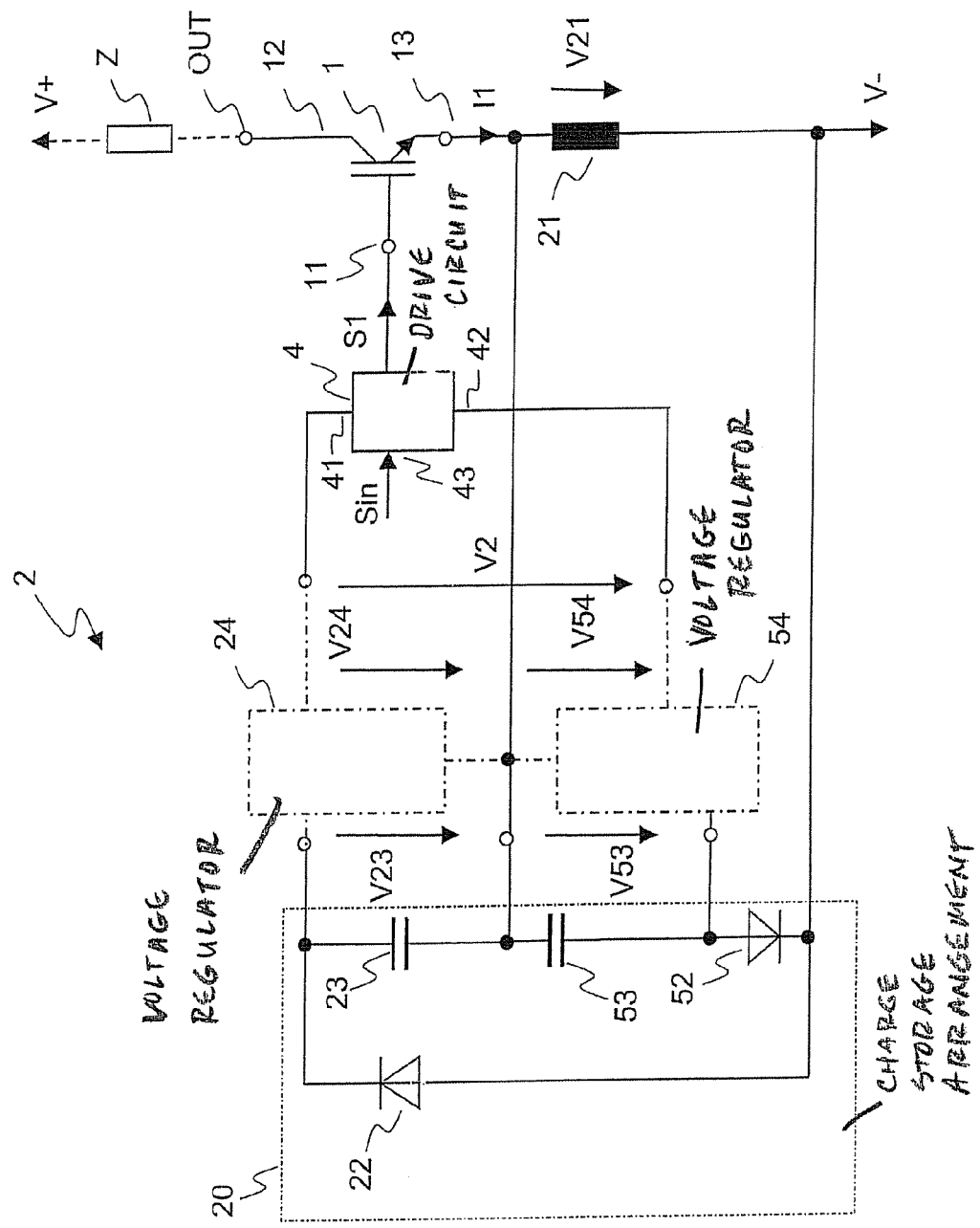
FIG. 6 illustrates a further embodiment of a circuit arrangement including a semiconductor switching element and a voltage supply circuit.

It was assumed for the explanations above that the semiconductor switching element 1 is interconnected as a high-side switch, that is to say that the load path is connected between the terminal for the positive supply potential and the load Z. However, the voltage supply circuit explained does also function in a corresponding manner for a semiconductor switching element used as a low-side-switch, as is illustrated in FIG. 6. In this case, the load path 12, 13 of the semiconductor switching element 1 is connected between the load Z and the negative supply potential V−. The voltages V21 induced in the inductance 21 during the switching of the semiconductor switching element correspond to the voltages that are induced in the inductance 21 if the semiconductor switching element is connected up as a high-side switch. The voltage supply circuit 2 illustrated in FIG. 6 for the purposes of explanation corresponds to the voltage supply circuit 2 explained above with reference to FIG. 5. It should be pointed out in this context that any other of the voltage supply circuits explained previously can also be used instead of this voltage supply circuit 2. The illustration of starting circuits has been omitted in the case of the voltage supply circuit 2 illustrated in FIG. 6. It goes without saying that such starting circuits may be provided.

Figure 7:
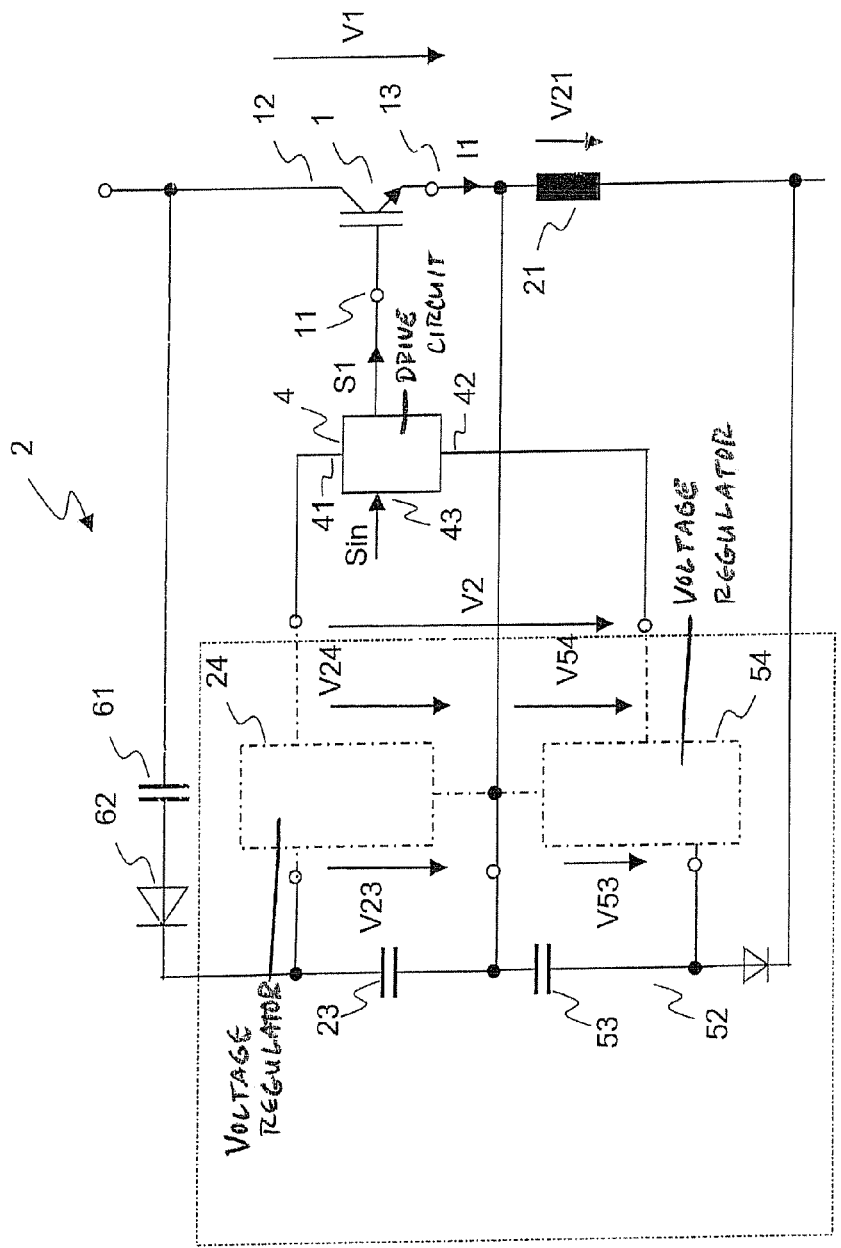
FIG. 7 illustrates one embodiment of a voltage supply circuit in which a positive and a negative supply voltage are generated in different ways.

Generation of the supply voltage V2 using an inductance connected in series with the load path 12-13 of the semiconductor switching element 1 may be combined with further measures for generating the supply voltage V2 from the electric circuit of the load. FIG. 7 illustrates one embodiment of a voltage supply circuit 2 which combines two different measures for generating the supply voltage. The voltage V53 that is negative relative to the reference point—i.e., the second load path terminal 13—is generated using the inductance 21, as already explained. For this purpose, the second capacitive storage element 53 is connected to the inductance via the second rectifier element 52.

In this circuit the positive voltage V23 is generated using a capacitive divider. A first terminal of the first capacitive storage element 23 is connected to the first load path terminal of the semiconductor switching element 1 via a series circuit including a coupling capacitance 61 and a rectifier element 62, such as a diode, and the second terminal of the first capacitive storage element 23 is connected to the second load path terminal of the semiconductor switching element 1. A voltage which corresponds to the load path voltage V1 of the semiconductor switching element is present across the series circuit including the first capacitive storage element 23, the coupling capacitance 61 and the rectifier element 62.

The voltage V1 rises each time when the semiconductor switching element is turned off. The first capacitive storage element 23 is then charged each time to a voltage which is related to the load path voltage. A relationship between these two voltages is given by the divider ratio of a capacitive voltage divider formed by the capacitive storage element 23 and the coupling capacitance 61. If the semiconductor switching element is subsequently driven in the on state, whereby the load path voltage V1 decreases, then the rectifier element 62 prevents the capacitive charge storage element from being discharged.

In a manner not illustrated in more specific detail, it is also possible to utilize a bootstrap principle for generating the negative supply voltage and the inductance 21 for generating the positive supply voltage.

Figure 8:
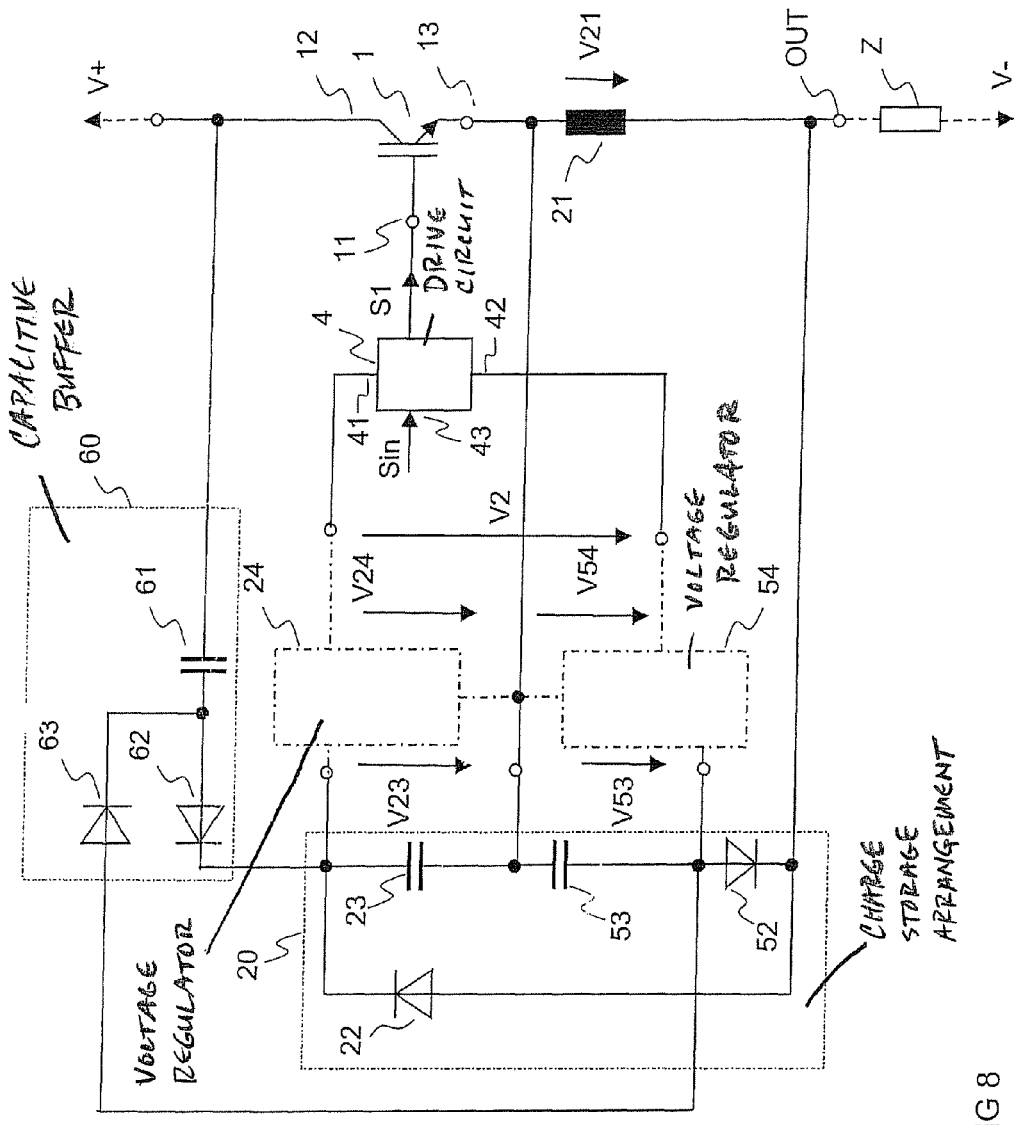
FIG. 8 illustrates one embodiment of a voltage supply circuit that generates supply voltages using inductances and bootstrap circuits.

FIG. 8 illustrates one embodiment of a circuit arrangement in which the positive supply voltage V23 and the negative supply voltage V53 are generated both using the inductance and using the capacitive divider principle. For this purpose, the voltage supply circuit 2 includes the circuit components already explained with reference to FIGS. 5 and 6 and, in addition, the divider circuit explained with reference to FIG. 7, the divider circuit also being supplemented by a further rectifier element, which is connected between that terminal of the second capacitive storage element 53 which is removed from the reference node and the coupling capacitance, and which enables the second capacitive storage element 53 to be charged in the case of a rising load path voltage of the semiconductor switching element 1.

The reference point for the supply voltage generated by the voltage supply circuit 2 is dependent on the position of the inductance 21 within the load path electric circuit. In this case, the load path electric circuit is the electric circuit containing the load path 12-13 of the semiconductor switching element 1. In the case of the circuit arrangements explained previously, the inductance 21 is connected directly to the second load path terminal 13 of the semiconductor switching element 1. In this case, the supply voltage V2, or the partial supply voltages V23, V53 and V24, V54, are referred to the second load path terminal 13 of the semiconductor switching element 1. Through a suitable choice of the position of the inductance 21 within the load path electric circuit, it is also possible, of course, to generate supply potentials which are referred to different electrical potentials than the electrical potential of the second load path terminal 13.

Figure 9:
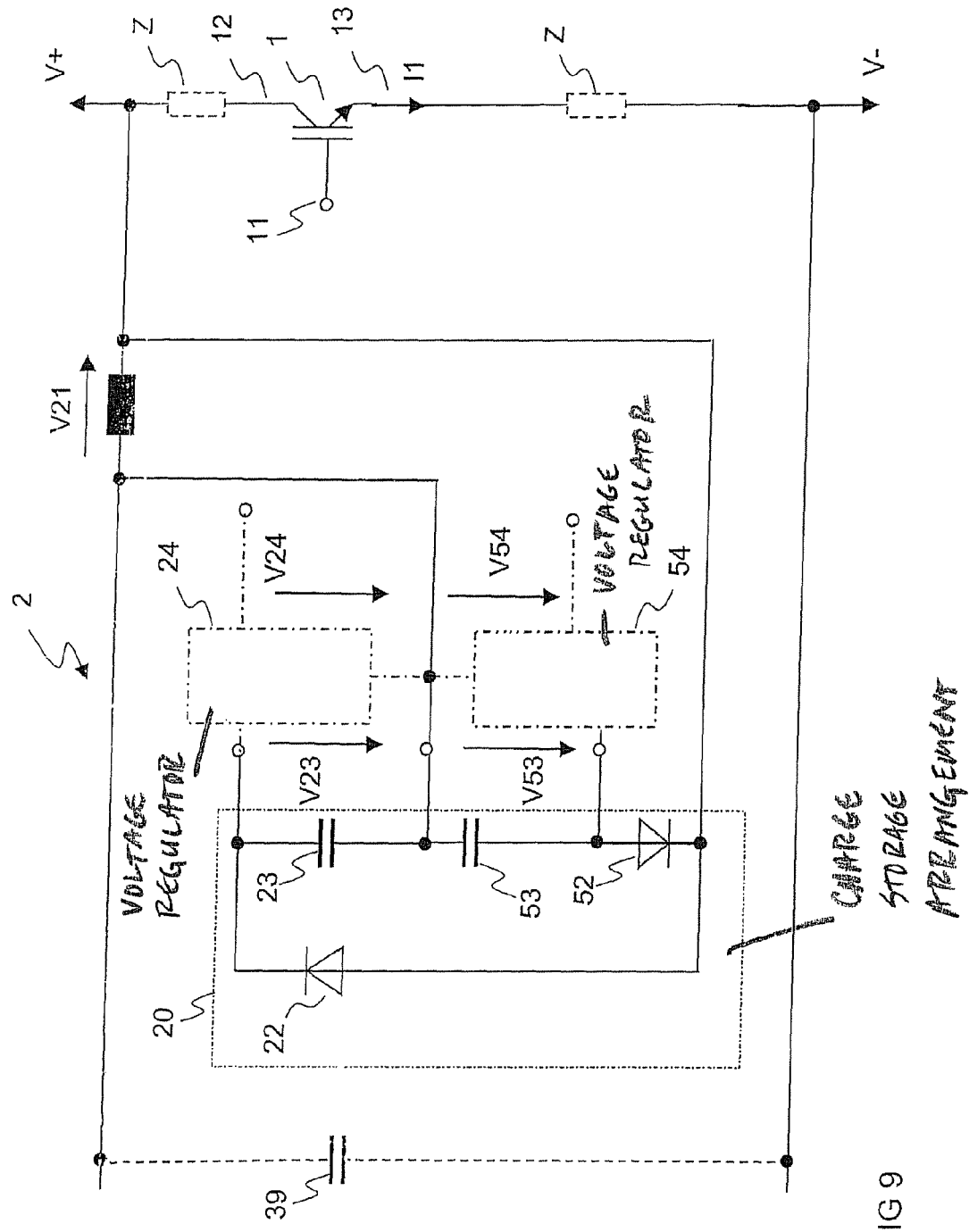
FIG. 9 illustrates another embodiment of a circuit arrangement including a semiconductor switching element and a voltage supply circuit.

FIG. 9 illustrates one embodiment of a circuit arrangement in which the voltage supply circuit 2 generates supply potentials which are referred to the positive load supply potential V+. In this case, the inductance 21 is connected between the terminal for the positive load supply potential and the load path 12-13 of the semiconductor switching element 1. The load supply potential can be generated—as has already been explained in connection with FIG. 2—for example using a rectifier and a capacitor 39 connected downstream of the rectifier. Only the capacitor 39 is illustrated in FIG. 7, for reasons of clarity. The inductance 21 is for example a line inductance of a conductor track or of some other electrically conductive connection between the terminal at which the load supply potential V+ is available and the load path 12-13 of the semiconductor switching element 1 and/or a bonding wire inductance. The voltage supply circuit 2 is connected to the inductance 21 in the same way as explained previously. The voltage supply circuit 2 illustrated in FIG. 9 corresponds to the voltage supply circuit already explained with reference to FIG. 5 and is designed to generate a partial supply voltage V23 or V24 which is positive relative to the positive load supply potential V+ and a partial supply potential V24 or V54 which is negative relative to the load supply potential V+, the sum of which corresponds to the supply voltage V2. It goes without saying that any other of the voltage supply circuits explained previously can also be used instead of this voltage supply circuit 2. Thus, by way of example, the series circuit including the second rectifier element 52 and the second capacitive storage element 53 and the optional voltage regulator 54 can be dispensed with if only a supply potential V23 or V54 which is positive relative to the positive load supply potential V+ is intended to be generated, which forms the supply voltage V2. In a corresponding manner, in the case of the voltage supply circuit 2 illustrated in FIG. 9—as well as in the case of the voltage supply circuits 2 already explained with reference to FIGS. 5 and 6—there is the possibility of dispensing with the series circuit including the first rectifying element 22 and the first capacitive storage element 23 if only a supply potential that is negative relative to the reference potential is intended to be generated, which forms the supply voltage. The reference potential is the electrical potential of the second load path 13 in the case of the examples in accordance with FIGS. 5 and 6 and the load supply potential V+ in the case of the example in accordance with FIG. 7.

Figure 10:
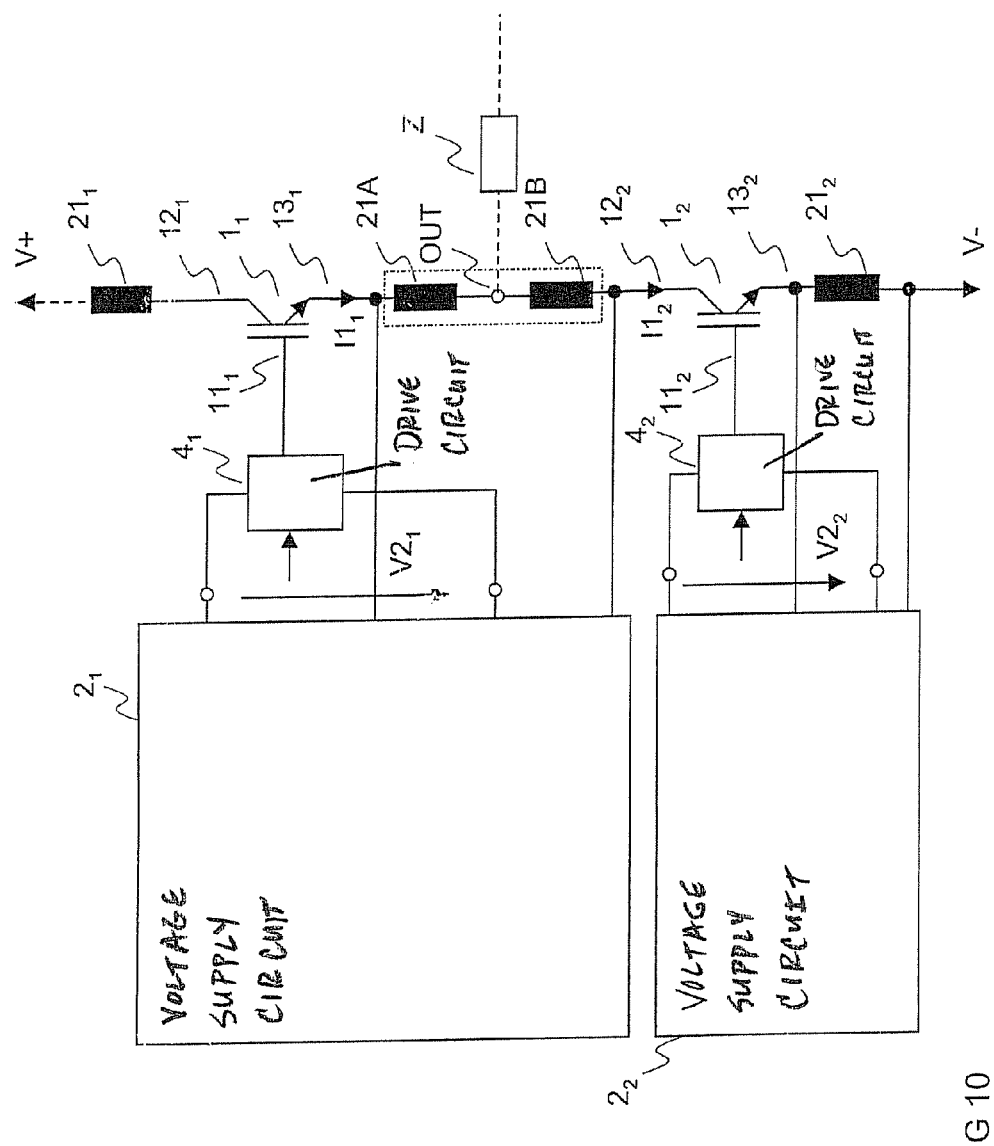
FIG. 10 illustrates one embodiment of the use of a circuit arrangement including a semiconductor switching element and a voltage supply circuit in a half-bridge circuit.

FIG. 10 illustrates one embodiment of a circuit arrangement having two semiconductor switching elements $1_1$, $1_2$, each having a drive terminal $11_1$, $11_2$ and also first and second load path terminals $12_1$, $12_2$, $13_1$, $13_2$. These two semiconductor switching elements $1_1$, $1_2$ which are realized as IGBTs in the example illustrated, are interconnected as a half-bridge by their load paths $12_1$-$13_1$, $12_2$-$13_2$ being connected in series with one another between terminals for a positive load supply potential V+ and a negative load supply potential V−. An output OUT of the half-bridge is formed by a node common to the load paths of the two semiconductor switching elements $1_1$, $1_2$. A load Z' (illustrated by dashed lines in FIG. 8) can be connected to the output OUT.

Drive circuits $4_1$, $4_2$ are present for driving the two semiconductor switching elements, supply voltages $V2_1$, $V2_2$ respectively being fed to the drive circuits by voltage supply circuits $2_1$, $2_2$. The voltage supply circuits $2_1$, $2_2$ can be in each case any one of the voltage supply circuits explained above. In order to provide the supply voltage $V2_1$ for the drive circuit $4_1$ of the high-side switching element $1_1$, the voltage supply $2_1$ utilizes two inductances: a first inductance 21A, which is connected between the second load path terminal $13_1$ of the first semiconductor switching element $1_1$ and the output OUT of the half-bridge; and a second inductance 21B, which is connected between the output OUT of the half-bridge and the first load path terminal $12_2$ of the second semiconductor switching element $1_2$. In this case, use is made of the fact that voltages V21A, V21B across these two inductances 21A, 21B each have the same polarity if the two semiconductor switching elements $1_1$, $1_2$ are respectively driven complementarily to one another, that is to say are respectively driven in such a way that only one of the two semiconductor switching elements is driven in the on state at the same point in time. This is briefly explained below: for this purpose it shall be assumed that at a given point in time the first semiconductor switching element $1_1$ is driven in the on state and the second semiconductor switching element $1_2$ is driven in the off state. In this case, a load current $I_1$ flows via the first semiconductor switching element $1_1$ and the output terminal OUT to the load, while a second load current $I_2$ through the second semiconductor switching element $1_2$ is zero. If, at a later point in time, the first semiconductor switching element $1_1$ is driven in the off state and the second semiconductor switching element $1_2$ remains turned off, then a voltage V21A not equal to zero is induced only in the first inductance 21A, which voltage is utilized by the voltage supply circuit $2_1$ for providing the supply voltage $V2_1$. If the load Z is an inductive load and if the second semiconductor switching element $1_2$ is driven in the on state when the first semiconductor switching element $1_1$ is turned off, such that the second semiconductor switching element $1_2$ accepts the previously flowing load current, then a load current starts to flow through the second semiconductor switching element $1_2$ counter to the current direction illustrated in FIG. 10. A voltage V21B is thereby induced in the second inductance 21B, the voltage having the same polarity as a voltage V21A induced in the first inductance 21A when the first load current $I1_1$ decreases.

The half-bridge illustrated in FIG. 10 is for example part of an H-bridge circuit which also include, in addition to the half-bridge illustrated, a further half-bridge, which can be realized in a manner corresponding to the half-bridge illustrated in FIG. 10. The half-bridge 10 illustrated in FIG. 10 can additionally be part of an inverter for driving a three-phase motor. In this case, in addition to the half-bridge illustrated, two further half-bridges are also present, which can be realized in a corresponding manner.

The voltage supply circuit $2_2$ that supplies the drive circuit $4_2$ of the low-side semiconductor switch utilizes, for providing the supply voltage $V2_2$, the inductance $21_2$ present between the second load path terminal $13_2$ and the terminal for negative supply potential V−.

Figure 11:
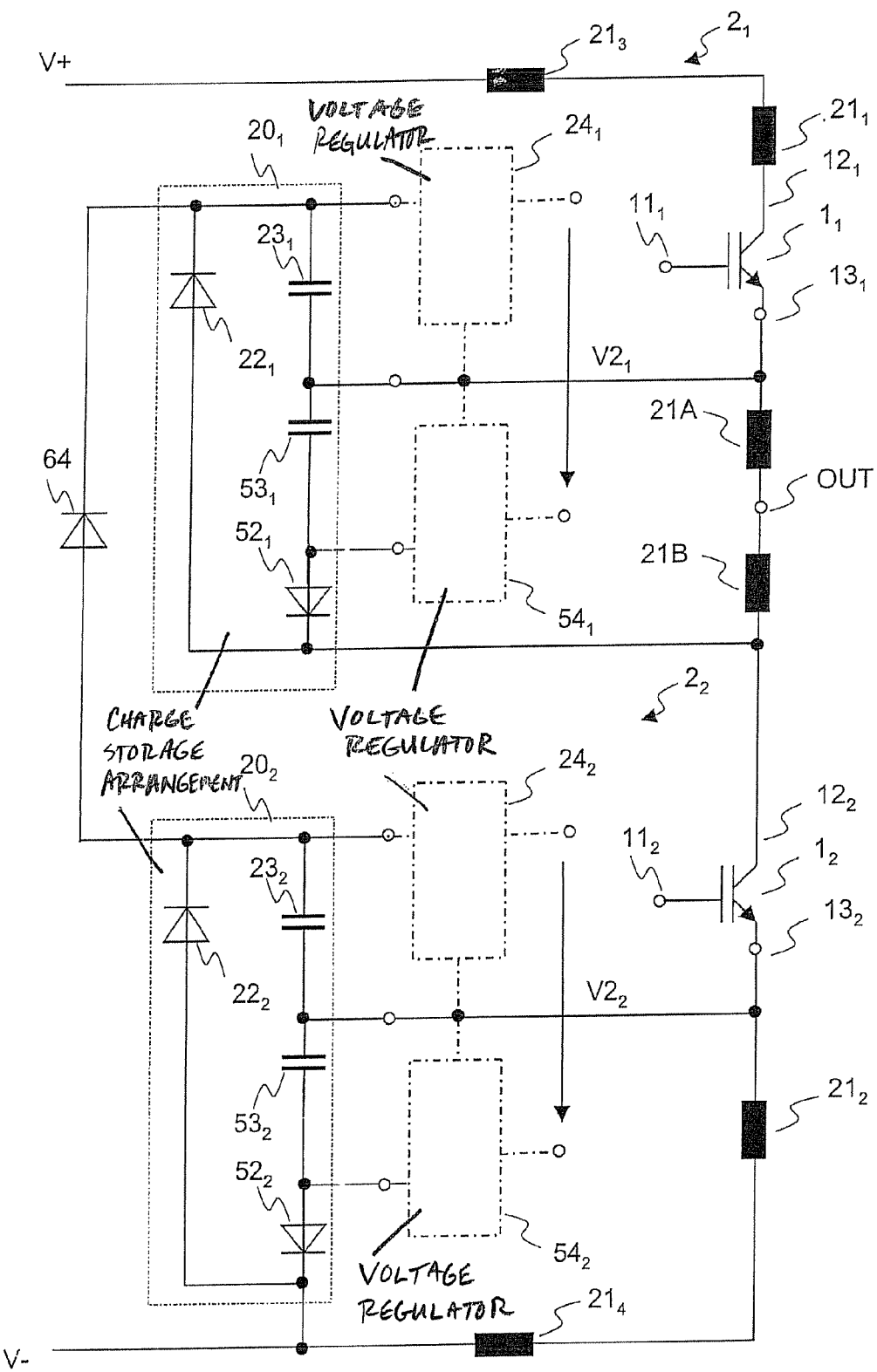
FIG. 11 illustrates one embodiment of a circuit arrangement including two voltage supply circuits coupled to one another.

FIG. 11 illustrates examples of the voltage supply circuits $2_1$, $2_2$ illustrated in FIG. 10 for the generation of two supply voltages $V2_1$, $V2_2$ in detail. These two voltage supply circuits $2_1$, $2_2$ are respectively realized in accordance with the voltage supply circuits explained with reference to FIGS. 5 and 6 and respectively generate a positive and a negative supply voltage. Starting circuits optionally present are not illustrated in FIG. 11. In the case of the circuit arrangement in accordance with FIG. 11, a rectifier element is connected between the first capacitive charge storage elements $23_1$, $23_2$ of the voltage supply circuits $2_1$, $2_2$. This rectifier element 64 enables charge equalization—bootstrap principle—between the two charge storage elements $23_1$, $23_2$, whereby the reliability of the circuit arrangement increases overall to the effect that a sufficient drive voltage can be generated for both semiconductor switching elements $1_1$, $1_2$. In the example illustrated, the rectifier element 64 is polarized in such a way that the first charge storage element $23_1$ of the first voltage supply circuit $2_1$ can be charged by the first charge storage element $23_2$ of the second voltage supply circuit $2_2$.

The charge equalization between the two first capacitive charge storage arrangements $23_1$, $23_2$ as explained above is independent of the specific realization of the voltage supply circuits $2_1$, $2_2$. Instead of the voltage supply circuits illustrated in FIG. 11, any other voltage supply circuits from among those explained above could also be used, in one embodiment there also being the possibility of realizing the two voltage supply circuits $2_1$, $2_2$ differently.

In the example illustrated in FIG. 11, the second voltage supply circuit $2_2$ utilizes two inductances: an inductance at the second load path terminal $13_2$ of the second semiconductor switching element $1_2$, which inductance is formed by bonding wires, for example; and an inductance $21_4$ of a lead or voltage supply line to the half-bridge circuit $1_1$, $1_2$. It goes without saying that the second voltage supply circuit $2_2$ could also be realized in such a way that it utilizes only one of these inductances.

In this context it should again be mentioned that, in the case of all the voltage supply circuits explained above, the inductances do not have to be separate components, rather parasitic inductances are utilized as inductances, such as e.g., leakage inductances, conductor track inductances, bonding wire inductances, or inductances that are formed by the geometrical construction of the circuit which includes the at least one semiconductor switching element. In the case of conductor track inductances, the inductance is "distributed" over the entire length of the conductor track, such that the inductance which is effective for voltage generation can be set by the choice of the connection points of the charge storage arrangement at the conductor track. It goes without saying that it is possible for these inductances that are present anyway to be increased in a targeted manner, for example by the geometry of the line routing being chosen in a suitable manner.

Figure 12:
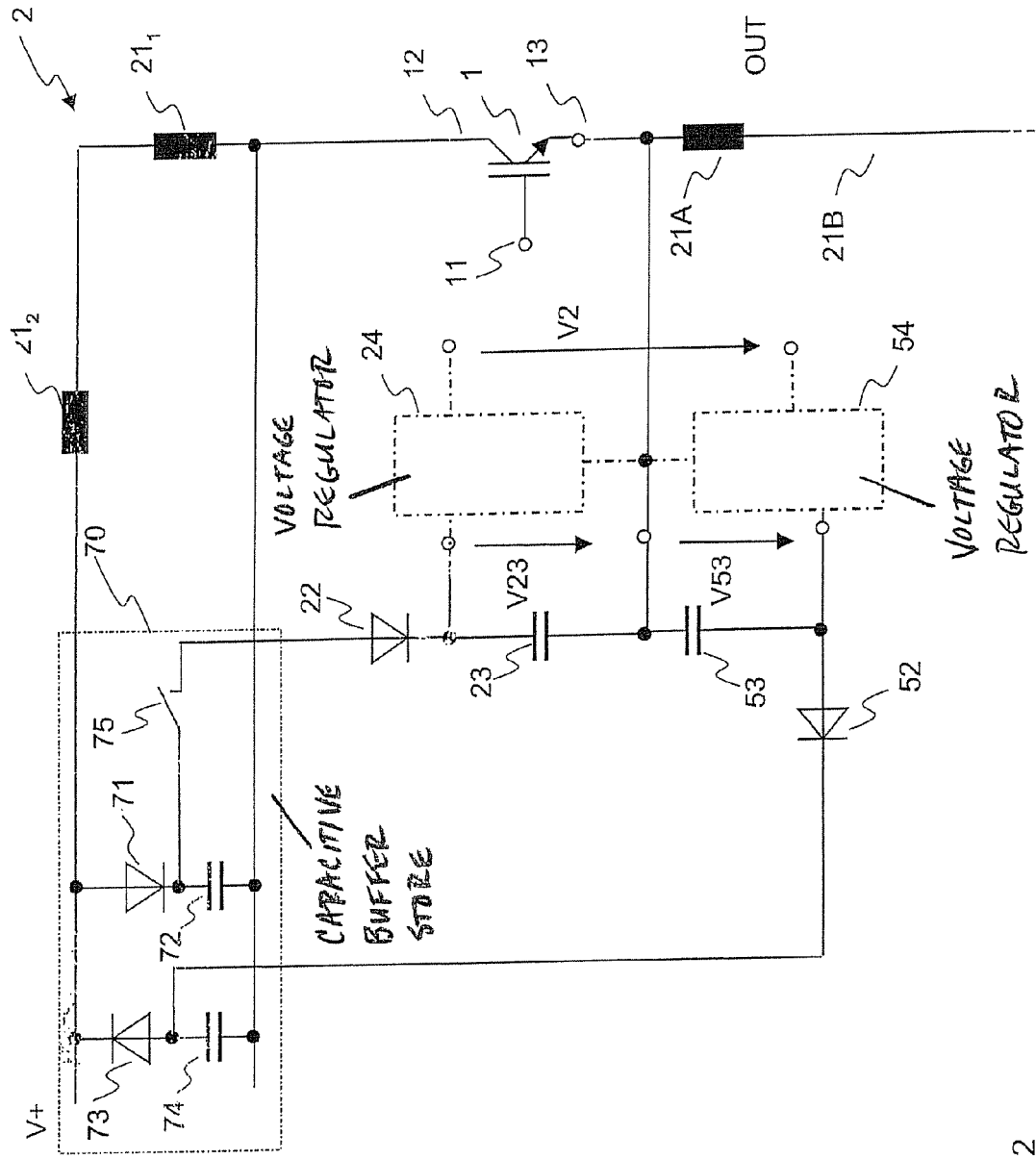
FIG. 12 illustrates another embodiment of a circuit arrangement including a semiconductor switching element and a voltage supply circuit.

FIG. 12 illustrates one embodiment of a voltage supply circuit that is able to generate, from inductances adjacent to the first load path terminal 12, a supply voltage V2 referred to the potential at the second load path terminal 13. The voltage supply circuit 2 illustrated generates two voltages: a first voltage V23, which is positive relative to the potential at the second load path terminal 13; and a second voltage V53, which is negative relative to the potential at the second load path terminal 13. Regulated voltages can be generated from these voltages in the manner explained. It goes without saying that it is also possible for only one of these voltages V23, V53 to be generated; the circuit components required for generating the respective other voltage can then be omitted.

Starting circuits are not illustrated in FIG. 12, but may of course be provided.

The voltage supply circuit 2 illustrated includes the first and second storage capacitances 23, 53 already explained. Unlike in the case of the voltage supply circuits explained previously, however, these storage capacitances in the example illustrated, via the first and second rectifier elements, are not connected directly to the inductance utilized for voltage generation, but rather to a capacitive buffer store 70. The capacitive buffer store includes two capacitive buffer store elements 72, 74, such as capacitors, for example, which are each connected in series with a rectifier element 71, 73, such as a diode, for example. The two rectifier elements are polarized differently and are respectively connected between the buffer store element 72, 74 and that terminal of the inductance which is remote from the first load path terminal 12, or the terminal for the upper supply potential V+.

The series circuits each including a buffer store element 72, 74 and a rectifier element 71, 73 are connected in parallel with one another and connected to the inductance. This inductance is composed of two partial inductances in the example illustrated: a first partial inductance $21_1$ adjacent to the first load path terminal 12, the first partial inductance being formed by bonding wires, for example; and a second partial inductance $21_3$, which is a lead inductance, for example. It goes without saying that it is also possible to utilize only one of these inductances for voltage generation.

The buffer store elements 72, 74 are charged during different switching operations of the semiconductor switching element: the first buffer store element 72 is charged when the semiconductor switching element 1 is switched on, if a positive voltage V21 in induced in the inductance $21_1$, $21_3$; and the second buffer store element 73 is charged when the semiconductor switching element 1 is switched off, if a negative voltage V21 is induced in the inductance $21_1$, $21_3$. The first buffer store element 72 is connected via a switching element 75—and the first rectifier element 22—to the first capacitive charge storage element 23, to be precise at a terminal remote from the first load path terminal 12. The switching element 75 is driven in the on state, for example, if the semiconductor switching element is turned on, and, when the semiconductor switching element 1 is driven in the on state, enables the first capacitive storage element 23 to be recharged. When the semiconductor switching element 1 is driven in the on state, the second capacitive storage element 53 is also recharged (bootstrap principle), to be precise directly via its rectifier element 52, which is connected to the second buffer store element 74, to be precise at a terminal remote from the first load path terminal 12.

Figure 13:
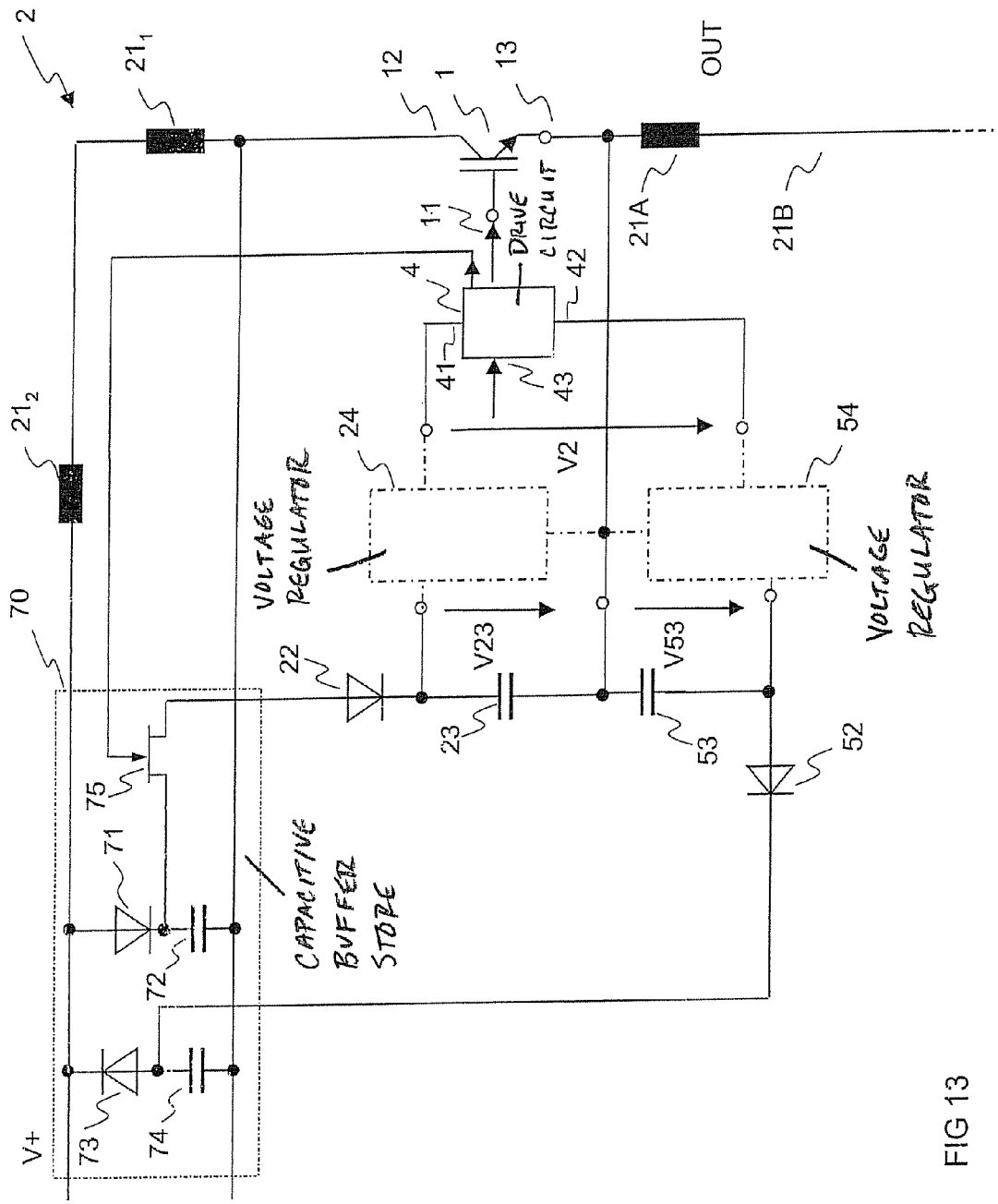
FIG. 13 illustrates a variant of the circuit arrangement according to FIG. 12.

FIG. 13 illustrates one embodiment of the voltage supply circuit 2 explained above in which the switching element 75 is realized as a normally off transistor, as a JFET in the example. This JFET is driven by the drive circuit 4 of the semiconductor switching element 1. The driving of the JFET 75 can be effected synchronously with the semiconductor switching element, but can also be effected in such a way that the JFET is driven in the on state only temporarily during switched-on durations of the semiconductor switching element. In this case, the switch-on phase of the JFET can lie temporally arbitrarily within a switch-on phase of the semiconductor switching element.

The circuit arrangements explained above can be used, for example, in intelligent power modules (IPM, integrated power modules).

Finally, it should be pointed out that circuit features that have been explained only in connection with one example can be combined with circuit features from other examples even if this has not been explicitly explained above. Thus, in one embodiment, features that are described in any of the claims below can be combined with features of any other claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement comprising:
a first semiconductor switching element having a load path and a drive terminal, the load path running between a first load path terminal and a second load path terminal; and
a voltage supply circuit, for providing a supply voltage the voltage supply circuit comprising:
a first side of an inductance connected in series with the load path of the first semiconductor switching element via the second load path terminal; and
a capacitive charge storage arrangement that includes a circuit with a rectifier element and a capacitive storage element, a cathode of the rectifier element directly coupled to a first side of the capacitive storage element via a first node, a second side of the capacitive storage element directly coupled to the second load path terminal, and an anode of the rectifier element directly coupled to a second side of the inductance via a second node, wherein a voltage across the capacitive storage element is the supply voltage.

2. The circuit arrangement of claim 1, wherein the inductance comprises at least one of the following inductances: a leakage inductance, a conductor track inductance, a bonding wire inductance, an inductance governed by a geometrical construction of the circuit arrangement.

3. The circuit arrangement as claimed in claim 1, furthermore comprising:
a drive circuit having voltage supply terminals, connected to the output terminals of the voltage supply circuit, and having a drive output connected to the drive terminal of the semiconductor switching element.

4. The circuit arrangement as claimed in claim 1, furthermore comprising a second semiconductor switching element having a load path and a drive terminal, wherein the inductance is arranged between the load paths of the first and second semiconductor switching elements.

5. A circuit arrangement comprising:
a first semiconductor arrangement having a load path running between a first load path terminal and a second load path terminal; and
a voltage supply circuit comprising:
a first side of an inductance coupled in series with the load path of the first semiconductor switching element via the second load path terminal; and
a capacitive charge storage arrangement including a first circuit having a rectifier element and a capacitive storage element, a cathode of the rectifier element directly coupled to a first side of the capacitive storage element via a first node, a second side of the capacitive storage element directly coupled to the second load path terminal, and an anode of the rectifier element directly coupled to a second side of the inductance via a second node.

6. The circuit arrangement of claim 5, further comprising:
a starting circuit coupled to the capacitive storage element.

7. The circuit arrangement of claim 6, wherein
the starting circuit includes a nonreactive resistor.

8. The circuit arrangement of claim 7, the starting circuit including a further rectifier element coupled in series with the nonreactive resistor.

9. The circuit arrangement of claim 6, the voltage supply circuit further comprising:
a voltage regulator configured to generate a regulated voltage from a voltage across the capacitive storage element.

10. The circuit arrangement of claim 5, the voltage supply circuit further comprising:
a voltage regulator configured to generate a regulated voltage from a voltage across the capacitive storage element.

* * * * *